(12) United States Patent
Zuliani et al.

(10) Patent No.: US 8,204,459 B2
(45) Date of Patent: Jun. 19, 2012

(54) TEMPERATURE IMPERVIOUS RADIO DEVICE AMPLIFIER OUTPUT POWER CONTROL

(75) Inventors: Michelle Zuliani, Vancouver (CA); Radu Oprea, Coquitlam (CA); Yosi Levi, Richmond (CA)

(73) Assignee: Cooper Technologies Company, Houston, TX (US)

( * ) Notice: Subject to any disclaimer, the term of this patent is extended or adjusted under 35 U.S.C. 154(b) by 310 days.

(21) Appl. No.: 12/619,713

(22) Filed: Nov. 17, 2009

(65) Prior Publication Data

US 2011/0117866 A1    May 19, 2011

(51) Int. Cl.
*H01Q 11/12*    (2006.01)
*H04K 3/00*    (2006.01)

(52) U.S. Cl. .................................. 455/127.1; 330/127
(58) Field of Classification Search .... 455/127.1–127.2; 330/127–135
See application file for complete search history.

(56) References Cited

U.S. PATENT DOCUMENTS 6,694,130 B2 * 2/2004 Loke et al. ................. 455/127.2
2006/0119426 A1 * 6/2006 Ichitsubo et al. ............... 330/66

* cited by examiner

*Primary Examiner* — Lee Nguyen
(74) *Attorney, Agent, or Firm* — Armstrong Teasdale LLP

(57) ABSTRACT

A radio device includes an amplifier and first and second independently operable variable voltage supply inputs to the amplifier, providing a consistent output power range for the radio device across widely varying temperature conditions.

21 Claims, 4 Drawing Sheets

TEMPERATURE IMPERVIOUS RADIO DEVICE AMPLIFIER OUTPUT POWER CONTROL

BACKGROUND OF THE INVENTION

The field of the invention relates generally to radio frequency transmission devices, and more specifically to regulating output power transmission of radio devices across varying temperature conditions.

Supervisory Control and Data Acquisition (SCADA) systems are in widespread use for monitoring and controlling industrial processes of all types. Such SCADA systems typically include a number of remotely monitored locations including sensors, and data and information associated with the sensors at each of the remotely monitored location are communicated to other locations in the system, and ultimately to a centralized computer system that manages data collected and controls operation of the system. Control commands can likewise be sent to the remote locations using a communications network. In certain applications, the use of long range radio devices in the communication networks are a practical necessity, and thus have generally been adopted in certain industries for SCADA systems.

DETAILED DESCRIPTION OF THE INVENTION

A high quality industrial radio typically requires an output power of range for signal transmission of 1 dBm to 20 dBm over a range of operating temperatures. Output power level performance of certain radio devices, however, have been found to undesirably fluctuate with temperature variations, and the full signal transmission range of 1 dBm to 20 dBm is not available at certain temperatures. In one example, a consistent output power range over an operating temperature range of −40° C. to 70° C. is desired. Certain radio devices have been found incapable of satisfying such a requirement.

Figure 1:
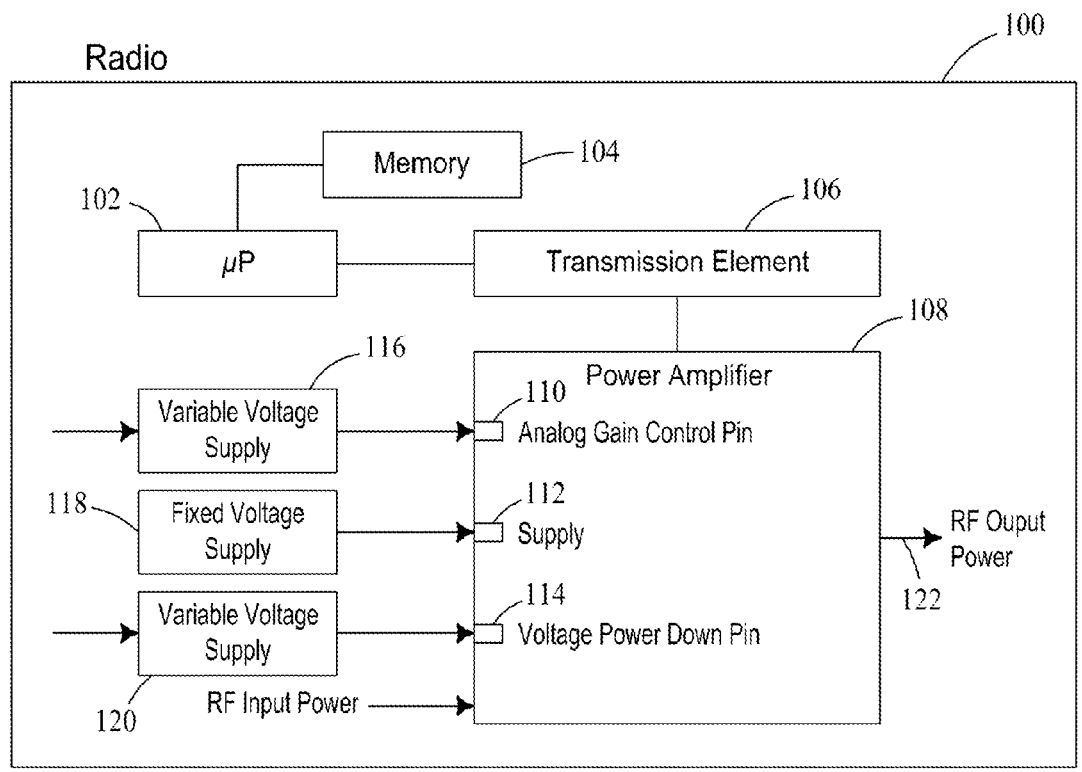
FIG. 1 is a schematic diagram of a first exemplary radio device.

FIG. 1 schematically illustrates a first exemplary embodiment of an industrial radio device 100. In the example shown, the radio device 100 is a programmable processor-based device including a processor 102 and a memory storage 104 wherein executable instructions, commands, and control algorithms, as well as other data and information such as communication network parameters required to satisfactorily operate the radio device 100 are stored. The memory 104 of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based device" shall refer to devices including a processor or microprocessor as shown, but also other equivalent element such as, microcontrollers, microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based device."

The radio device 100 also includes a radio transmission element 106 that may include a transmitter and a receiver. Alternatively, the transmitter and receiver may be combined into a single device referred to as a transceiver. The radio transmission element 106 sends and receives wireless, radio frequency data signals using known techniques. The data and information communicated with the radio transmission element 106 may be processed, formatted or converted into an appropriate communications protocol by the processor 102 utilizing information stored in the memory 100. For example, digital radio frequency signals may be transmitted and received using a specified protocol for the contents of the data messages sent in a particular communications network.

The radio device also includes an amplifier 108 such as a power amplifier chip having an analog gain control pin 100, a supply voltage pin 112, and a voltage power down pin 114 for control purposes. In an exemplary embodiment the amplifier chip may be a medium-power high efficiency amplifier IC manufactured using a Gallium Arsenide Heterojunction Bipolar Transistor (HBT) process, such as a RF2172 3.6V, 250 mW Amp with Analog Gain Control available from RF Micro Devices, Inc. of Greensboro, N.C. Other amplifiers are, however, available and may be utilized in alternative embodiments if desired.

As shown in FIG. 1, a first variable voltage supply 116 is connected to the analog gain control pin 110, a fixed voltage supply 118 is connected to the voltage supply pin 112, and a second variable voltage supply 120 is connected to the voltage power down pin 114. Typically, the supply voltage 118 of the RFMD RF2172 chip is fixed at a constant level, the second variable voltage power source 120 is varied only when the chip is turned on and off, and the first variable voltage supply 116 is used to control the output power level 122 for radio transmission.

It has been found, however, that the radio device 100 shown in FIG. 1 does not provide a consistent range of RF output power levels, such as a signal transmission range of 1 dBm to 20 dBm at certain temperatures. Especially when the radio device 100 is exposed to a large temperature range in use, such as a temperature range of about −40° C. to about 70° C., the inconsistent signal transmission range of the radio device 100 is problematic. When the radio device 100 is set to produce a predetermined power level at the output 122, the actual output power level produced may or may not correspond to the predetermined power level. That is, at certain temperatures the radio device 100 may perform as desired, and at other temperatures considerable deviation in radio performance may be observed due to output power fluctuations of the amplifier 108.

At some temperatures, certain power output levels may not be not obtainable at all with the radio device 100, and thus the range of output power levels capable of being produced by the device 100 may be considerably smaller than a desired signal transmission range, such as the aforementioned 1 dBm to 20 dBm range in one example. Communication network performance and reliability issues may therefore result in certain temperature ranges and with changes in temperature. Such issues are especially problematic when multiple radios in a network are negatively affected by certain temperature conditions. Additionally, such problems are perhaps more acute for so-called long-range radio devices that transmit and/or receive signals over distances of 10-20 km, for example.

While temperature compensation circuitry is perhaps possible in the radio device 100 to address such temperature related power level issues and achieve a consistent range of power output levels over relatively large temperature ranges, in many cases it is simply impractical to do so. Specifically, implementing temperature compensation features generally requires additional equipment and calibration during production testing which is impractical and cost-prohibitive for manufactures and suppliers of relatively low volume, special use radio devices.

Figure 2:
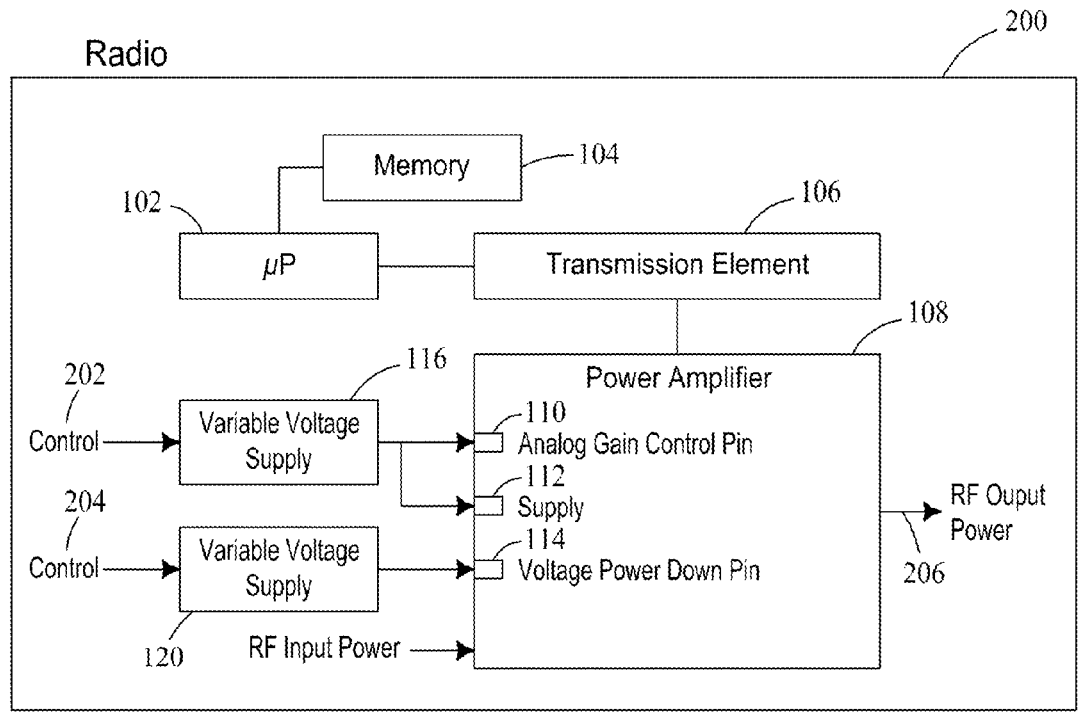
FIG. 2 is a schematic diagram of second exemplary radio device.

FIG. 2 illustrates a radio device 200 that effectively overcomes the difficulties noted above in a cost effective manner without requiring expensive temperature compensation features. Like features of the radio 200 and the radio 100 are indicated with like reference characters in the figures.

Comparing FIGS. 1 and 2, it can be seen that the input connections of the amplifier 108 are different. The fixed voltage supply 118 shown in FIG. 1 is eliminated, and the first variable voltage power supply 116 is connected to each of the analog gain control pin 110 and the supply pin 112. The second variable voltage supply 120 remains connected to the voltage power down pin 114 of the amplifier 108. As also shown in FIG. 2, the first and second variable voltage supplies 202 and 204 are separately and independently controlled with separate control elements 202 and 204. Control elements and circuitry suitable for the control elements 202 and 204 are known and accordingly not described in further detail herein.

In the exemplary embodiment shown in FIG. 2, the voltages on all three amplifier pins 110, 114, and 116 are used to control the RF power level 206 in use. Unlike the radio device 100 that is susceptible to inconsistent and unacceptable power output ranges at certain temperatures, testing has shown that the when the radio device 200 is appropriately calibrated at room temperature, the radio device 200 performs far more consistently than the radio device 100 to reliably produce desired power output levels, and also a consistent range of output power ranges, across widely varying temperature ranges.

As such, and even somewhat unexpectedly, a superior radio device 200 can be provided for applications exposing the radio device(s) to large temperature fluctuations. That is, a substantially temperature impervious radio device 200 may be provided at comparable cost to the radio device 100 by applying a different input power control scheme to the amplifier 108, causing the amplifier to reliably and consistently perform with a desired output power level and range of output power despite large differences in ambient environmental temperatures.

Exemplary voltage level settings for the variable voltage supplies 116, 118 on the respective amplifier analogue gain control pin 110, voltage supply pin 112, and the voltage power down pin 114 in the radio device 200 are shown in Table 1 that provide output power levels in the aforementioned range of about 1 dBm to 20 about dBm. The output power levels shown in Table 1 correspond to an output power level 206 for the radio device 100 at a frequency of 2.4015 GHz.

TABLE 1

Output Power and Control Voltage Levels

| Output Power (dBm) | Supply Voltage (V) | Analogue Gain Control Pin Voltage (V) | VPD Voltage (V) |
| --- | --- | --- | --- |
| 20 | 2.467 | 2.467 | 2.869 |
| 19 | 2.467 | 2.467 | 2.848 |
| 18 | 2.361 | 2.361 | 2.699 |
| 17 | 2.286 | 2.286 | 2.571 |
| 16 | 2.209 | 2.209 | 2.467 |
| 15 | 2.164 | 2.164 | 2.386 |
| 14 | 2.103 | 2.103 | 2.294 |
| 13 | 2.043 | 2.043 | 2.212 |
| 12 | 1.997 | 1.997 | 2.131 |
| 11 | 1.951 | 1.951 | 2.062 |
| 10 | 1.905 | 1.905 | 1.994 |
| 9 | 1.905 | 1.905 | 1.912 |
| 8 | 1.905 | 1.905 | 1.854 |
| 7 | 1.905 | 1.905 | 1.769 |
| 6 | 1.905 | 1.905 | 1.750 |
| 5 | 1.905 | 1.905 | 1.715 |
| 4 | 1.905 | 1.905 | 1.668 |
| 3 | 1.905 | 1.905 | 1.633 |
| 2 | 1.905 | 1.905 | 1.598 |
| 1 | 1.905 | 1.905 | 1.562 |

As can be seen from Table 1, in the exemplary output power range of 1 dBm to 8 dBm, the supply voltage 116 is set higher than the supply voltage 120 for the amplifier inputs. At an output power of about 9 dBM, the supply voltages 116 and 118 are set approximately equal. At output power levels of 10 dBm to 20 dBm the supply voltage 116 is set less than the supply voltage 118. The voltage supply values in Table 1 may be loaded in the radio memory 104 in a look up table or in other form that allows the processor 102 to implement the desired voltage supply settings to produce a selected power output level for the radio device 200.

Figure 3:
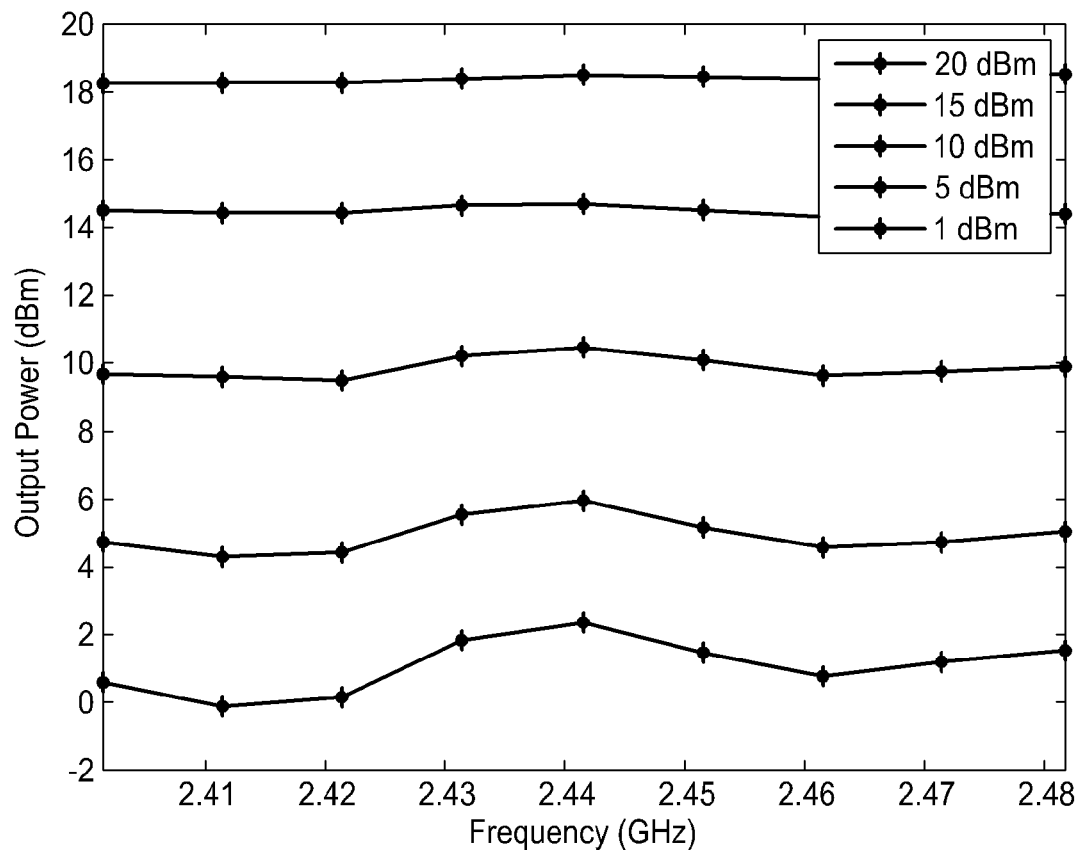
FIG. 3 is a first graph of exemplary output power versus frequency data for the radio device shown in FIG. 2 at a first exemplary temperature.
Figure 4:
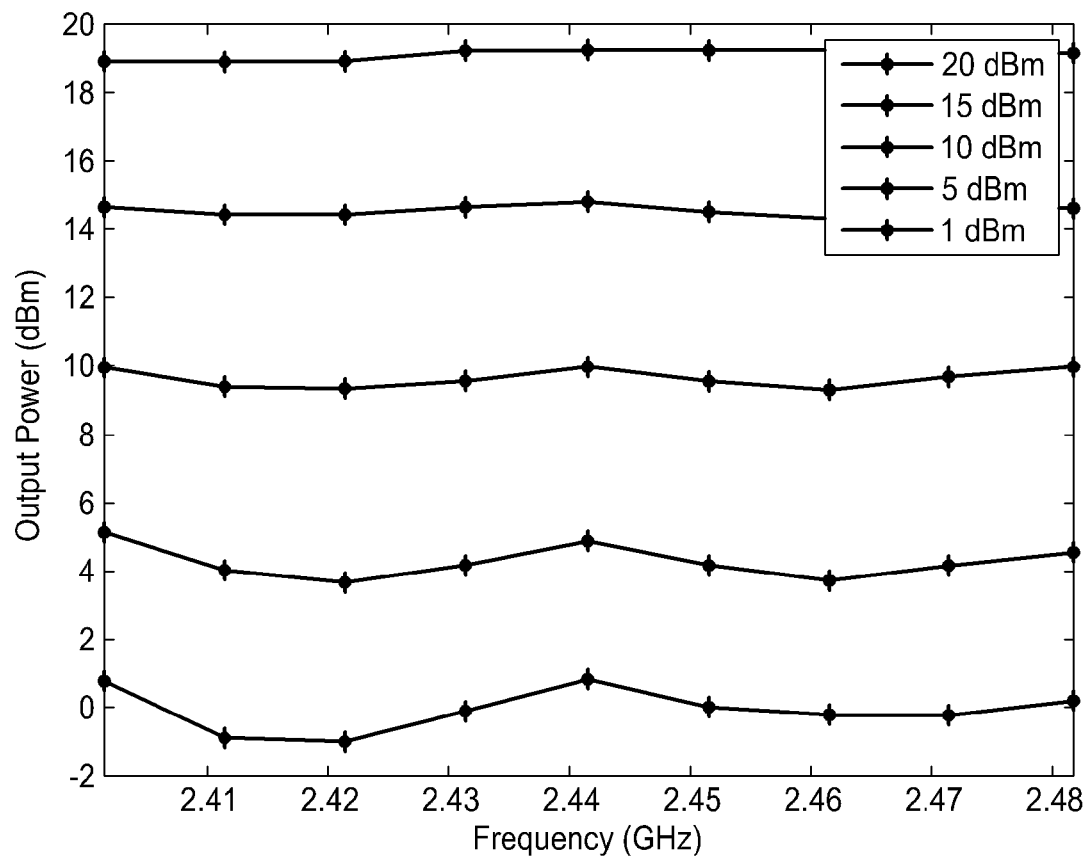
FIG. 4 is a second graph of exemplary output power versus frequency data for the radio device shown in FIG. 2 at a second exemplary temperature.
Figure 5:
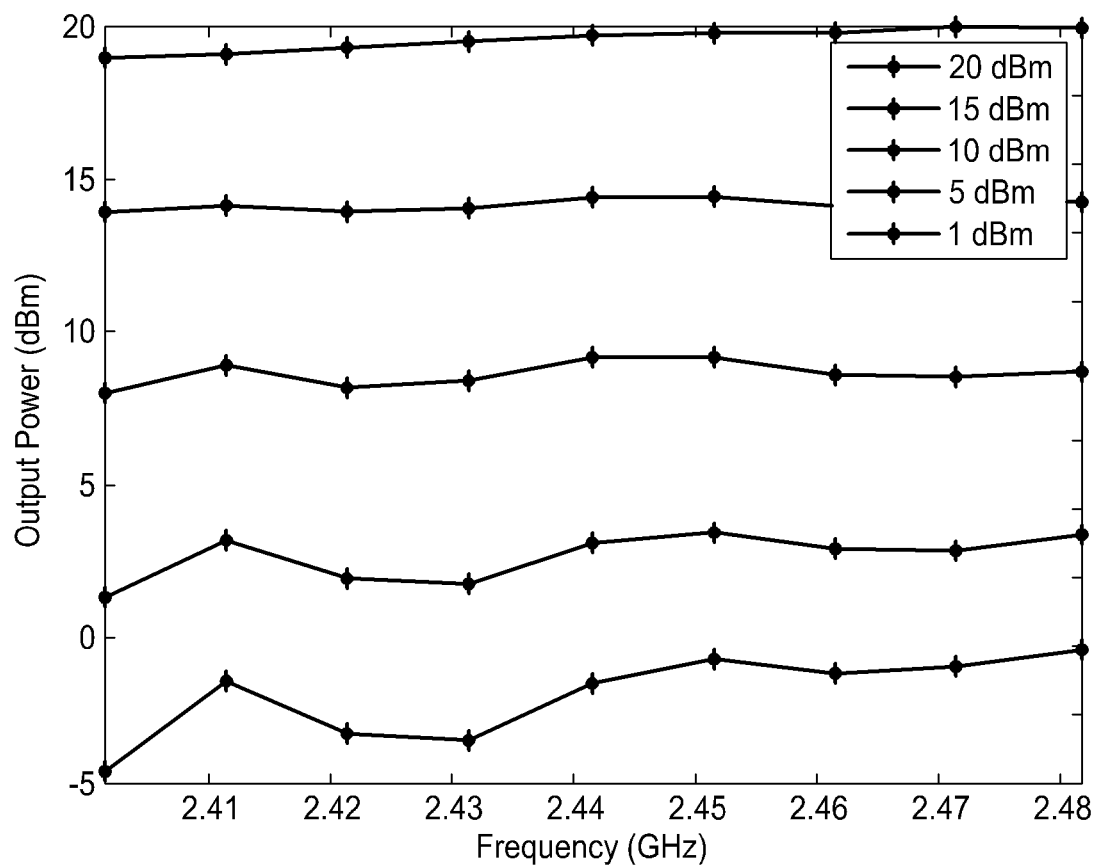
FIG. 5 is a third graph of exemplary output power versus frequency data for the radio device shown in FIG. 2 at a third exemplary temperature.

The range of output power of the radio device 200 shown in FIG. 2 using the designated input voltage settings to the amplifier pins 110, 112 and 114 shown in Table 1 has been measured over widely varying temperatures. Exemplary results at 70° C., 25° C. and −40° C. are shown in FIGS. 3, 4 and 5, respectively. Output power is further shown in FIGS. 3, 4, and 5 across a range of different frequencies for signal transmission.

As can be seen from FIGS. 3-5, the radio device 200 is substantially temperature impervious with respect to output power performance. In other words, the radio device 200 is not unduly influenced or affected by large temperature fluctuations such as the exemplary temperature range discussed. A comparatively stable and consistent output power level range is provided by the radio device 200 across a temperature range of about 110° C. (e.g., a range of about −40° C. to about 70° C. as shown in FIGS. 3 and 5). As FIGS. 3-5 also indicate, relatively minor frequency adjustments can provide further output power level performance improvements at certain temperatures with certain power levels, particularly the lower power levels in the range of about 1 dBm to about 5 dBm as shown in FIGS. 3-5.

While an exemplary power output level range and temperature range, and particular voltage settings for the amplifier inputs in the radio device 200 are described in some detail, it should be understood that these are exemplary only. That is, it is contemplated that other voltage settings for the amplifier inputs could be alternately selected to achieve still other power output level ranges inclusive of but not limited to the 1 dBm to 20 dBm range discussed, and/or to address other possible temperature ranges inclusive of but not limited to the exemplary 110° C. temperature range between about −40° C.

to about 70° C. as described. In other words, and as one example, an output power level range may be possible using similar techniques and methodology with an upper bound greater than 20 dBm and/or a lower bound less than 1 dBm for a temperature range having a different lower and/or upper bound than −40° C. and 70° C., respectively.

The benefits and advantages of the inventive concepts disclosed are believed to be amply demonstrated in the exemplary embodiments disclosed.

An exemplary embodiment of a radio device is disclosed including: a radio transmission element; an amplifier having a voltage supply pin, an analog gain control pin, and voltage power down pin; a first variable voltage supply connected to the voltage supply pin; and a second variable voltage supply connected to the voltage power down pin.

Optionally, the first variable voltage supply and the second variable voltage supply may be calibrated to produce a consistent output power range over a predetermined temperature range. The predetermined temperature range may be approximately −40° C. to 70° C., and the consistent output power range may be about 1 dBm to about 20 dBm. The first variable voltage supply may further be connected to the analog gain control pin, such that the first variable voltage supply provides a first input voltage to the analog gain control pin and the supply pin, the second variable voltage supply provides a second input voltage to the voltage power down pin; and the first and second variable voltage supplies are independently operable. The second input voltage may be set higher than the first input voltage, may be set lower than the first input voltage, or may be set approximately equal to the first input voltage. The first input voltage may be set within a range of about 1.9V to about 2.5V, and the second input voltage may be set within a range of about 1.5V to about 2.9V.

Also optionally, the first input voltage may be set lower than the second voltage to provide a consistent output power level over a first portion of the output power range and may be set higher than the second voltage to provide a consistent power output level over a second portion of the output power range, with the second portion being different from the first portion. The output power range may be about 1 dBm to about 20 dBm. The radio device may operate within a frequency range of about 2.40 GHz to about 2.48 GHz. The output power range may be consistently produced across a temperature range of approximately −40° C. to 70° C. The radio device may be configured for long range signal transmission.

An embodiment of a processor based radio device is also disclosed including: a radio transmission element; an amplifier having a voltage supply pin, an analog gain control pin, and voltage power down pin; a first variable voltage supply connected to each of the analog gain control pin and the voltage supply pin; and a second variable voltage supply connected to the voltage power down pin. The first and second variable voltage supplies are independently controlled to provide a substantially temperature impervious range of output power across a predetermined temperature range. Optionally, the range of output power is about 1 dBm to about 20 dBm, the radio device operates within a frequency range of about 2.40 GHz to about 2.48 GHz, and the range of output power is consistently produced across a temperature range of approximately −40° C. to 70° C.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A radio device comprising:
a radio transmission element;
an amplifier having a voltage supply pin, an analog gain control pin, and a voltage power down pin;
a first variable voltage supply connected to the voltage supply pin; and
a second variable voltage supply connected to the voltage power down pin.

2. The radio device of claim 1, wherein the first variable voltage supply and the second variable voltage supply are calibrated to produce a consistent output power range over a predetermined temperature range.

3. The radio device of claim 2, wherein the predetermined temperature range is approximately −40° C. to 70° C.

4. The radio device of claim 2, wherein the consistent output power range is about 1 dBm to about 20 dBm.

5. The radio device of claim 1, wherein the first variable voltage supply is further connected to the analog gain control pin.

6. The radio device of claim 5, wherein:
the first variable voltage supply provides a first input voltage to the analog gain control pin and the supply pin;
wherein the second variable voltage supply provides a second input voltage to the voltage power down pin; and
wherein the first and second variable voltage supplies are independently operable.

7. The radio device of claim 6, wherein the second input voltage is set higher than the first input voltage.

8. The radio device of claim 6, wherein the second input voltage is set lower than the first input voltage.

9. The radio device of claim 6, wherein the second input voltage is set approximately equal to the first input voltage.

10. The radio device of claim 6, wherein the first input voltage is set within a range of about 1.9V to about 2.5V.

11. The radio device of claim 6, wherein the second input voltage is set within a range of about 1.5V to about 2.9V.

12. The radio device of claim 6, wherein the first input voltage is set lower than the second voltage to provide a consistent output power level over a first portion of the output power range.

13. The radio device of claim 12, wherein the first input voltage is set higher than the second voltage to provide a consistent power output level over a second portion of the output power range, the second portion being different from the first portion.

14. The radio device of claim 13, wherein the output power range is about 1 dBm to about 20 dBm.

15. The radio device of claim 13, wherein the radio device operates within a frequency range of about 2.40 GHz to about 2.48 GHz.

16. The radio device of claim 13, wherein output power range is consistently produced across a temperature range of approximately −40° C. to 70° C.

17. The radio device of claim 1, wherein the radio device is configured for long range signal transmission.

18. A processor based radio device comprising:
a radio transmission element;
an amplifier having a voltage supply pin, an analog gain control pin, and a voltage power down pin;
a first variable voltage supply connected to each of the analog gain control pin and the voltage supply pin; and a second variable voltage supply connected to the voltage power down pin;

wherein the first and second variable voltage supplies are independently controlled to provide a substantially temperature impervious range of output power across a predetermined temperature range.

19. The radio device of claim 18, wherein the range of output power is about 1 dBm to about 20 dBm.

20. The radio device of claim 18, wherein the radio device operates within a frequency range of about 2.40 GHz to about 2.48 GHz.

21. The radio device of claim 18, wherein the range of output power is consistently produced across a temperature range of approximately −40° C. to 70° C.

* * * * *

UNITED STATES PATENT AND TRADEMARK OFFICE
CERTIFICATE OF CORRECTION

PATENT NO. : 8,204,459 B2
APPLICATION NO. : 12/619713
DATED : June 19, 2012
INVENTOR(S) : Michelle Zuliani et al.

It is certified that error appears in the above-identified patent and that said Letters Patent is hereby corrected as shown below:

In the Specification

In Column 3, Line 60, regarding voltage supply 118, delete "118" and insert therefor -- 120 --.

In Column 4, Line 29, regarding voltage supply 118, delete "118" and insert therefor -- 120 --.

In Column 4, Line 31, regarding voltage supply 118, delete "118" and insert therefor -- 120 --.

In the Claims

In Column 6, Line 45, in Claim 12, delete "the" and insert therefor -- an --.

Signed and Sealed this
Tenth Day of December, 2013

Margaret A. Focarino
*Commissioner for Patents of the United States Patent and Trademark Office*